(12) United States Patent
Fu et al.

(10) Patent No.: US 10,115,927 B2
(45) Date of Patent: Oct. 30, 2018

(54) DISPLAY SUBSTRATE, DISPLAY PANEL AND DISPLAY DEVICE

(71) Applicant: BOE TECHNOLOGY GROUP CO., LTD., Beijing (CN)

(72) Inventors: Jie Fu, Beijing (CN); Xiaochuan Chen, Beijing (CN); Shengji Yang, Beijing (CN); Dongni Liu, Beijing (CN); Lei Wang, Beijing (CN); Li Xiao, Beijing (CN); Pengcheng Lu, Beijing (CN); Han Yue, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/715,323

(22) Filed: Sep. 26, 2017

(65) Prior Publication Data
US 2018/0108860 A1    Apr. 19, 2018

(30) Foreign Application Priority Data
Oct. 14, 2016   (CN) .................... 2016 2 1126071 U

(51) Int. Cl.
| H01L 29/20 | (2006.01) |
| H01L 33/00 | (2010.01) |
| H01L 51/52 | (2006.01) |
| H01L 27/32 | (2006.01) |
| H05B 33/08 | (2006.01) |

(52) U.S. Cl.
CPC ...... *H01L 51/5221* (2013.01); *H01L 27/3206* (2013.01); *H01L 51/5206* (2013.01); *H05B 33/0896* (2013.01)

(58) Field of Classification Search
CPC ............. H01L 51/5221; H01L 27/3206; H01L 51/5206; H05B 33/0896
See application file for complete search history.

(56) References Cited

U.S. PATENT DOCUMENTS

| 4,243,435 | A  | * | 1/1981 | Barile | ............... | H01L 21/033 |
| | | | | | | 148/DIG. 139 |
| 2002/0109147 | A1 | * | 8/2002 | Shirai | ............... | G02B 6/4249 |
| | | | | | | 257/93 |
| 2003/0184214 | A1 | * | 10/2003 | Lee | ............... | H01J 1/304 |
| | | | | | | 313/497 |

(Continued)

*Primary Examiner* — Victor A Mandala
(74) *Attorney, Agent, or Firm* — Brooks Kushman P.C.

(57) ABSTRACT

A display substrate, a display panel and a display device are provided. The display substrate includes: a base substrate including a plurality of display units, wherein each of the plurality of display units is provided with an anode, an organic light-emitting layer and a cathode, wherein anodes of different display units are separated from each other; a plurality of cathode lines connected to the driving ICs, wherein the cathode lines are arranged between the cathode and the base substrate; an insulating layer arranged between the cathode lines and the cathodes, wherein a plurality of cathode windows corresponding to the cathode lines formed in the insulating layer, wherein at least part of the plurality of cathode windows respectively corresponds to at least two display regions, a cathode at each of the display region is connected to the respective cathode line via the cathode window corresponding to the display region.

19 Claims, 5 Drawing Sheets

(56) References Cited

U.S. PATENT DOCUMENTS

| | | | | |
|---|---|---|---|---|
| 2010/0279458 A1* | 11/2010 | Yeh | ................. | H01L 31/022425 |
| | | | | 438/98 |
| 2010/0308371 A1* | 12/2010 | Bui | ................... | H01L 31/02024 |
| | | | | 257/184 |
| 2014/0239157 A1* | 8/2014 | Burgess | ................. | H01J 31/26 |
| | | | | 250/208.1 |
| 2015/0362165 A1* | 12/2015 | Chu | .................... | H01L 25/0753 |
| | | | | 362/235 |
| 2017/0194298 A1* | 7/2017 | Negley | ............... | H01L 25/0756 |
| 2018/0047876 A1* | 2/2018 | Chu | ...................... | H01L 27/156 |

* cited by examiner

DISPLAY SUBSTRATE, DISPLAY PANEL AND DISPLAY DEVICE

CROSS-REFERENCE TO RELATED APPLICATION

This application claims priority to Chinese Patent Application No. 201621126071.7 filed on Oct. 14, 2016, which is incorporated herein by reference in its entirety.

TECHNICAL FIELD

The present disclosure relates to the field of display technology, and more particularly to a display substrate, a display panel and a display device.

BACKGROUND

An organic light-emitting diode (OLED) display device displays an image by using a reversible color-change phenomenon generated by organic semiconductor material driven by current. The OLED display device has advantages such as being ultra light and ultrathin, high brightness, wide viewing angle, low voltage, low power consumption, fast response, high resolution, good shock resistance, being flexible, low cost, simple manufacturing process, less raw material usage, high light-emitting efficiency and wide operation temperature, so that the OLED device is considered as a most promising new generation of display technology.

A basic structure of the OLED includes an anode, an organic light-emitting layer and a cathode, the organic light-emitting layer is sandwiched between the anode and the cathode. When the anode and the cathode are applied with signals, positive electron holes interact with electric charges at the cathode in the organic light-emitting layer to generate light, which may generate a Red color light, a Green color light or a Blue color light depending on its arrangement, such that the OLEDs may generate three-primary colors of RGB.

Obviously, on the basis of the above OLED structure, the larger size of the screen of the display device, the longer a corresponding cathode line and an anode line. Since the OLED is a current-driven element, a longer line may result in a greater resistance, that is, the more away from a signal source, the greater voltage drop, such that the display panel is of non-uniform luminance due to a difference between a luminance of a light-emitting unit close to the signal source and a luminance of a light-emitting unit away from the signal source. Therefore, in the related art, a large-sized OLED display device is obtained by splicing a plurality of individual small-sized OLED display substrates.

However, in such large-sized OLED display device obtained by splicing the plurality of individual small-sized OLED display substrates, a non-display splicing region between every two individual small-sized display substrates is large, which adversely affects the display quality.

SUMMARY

An object of the present disclosure is to reduce an area of the non-display region in the OLED display device, so as to improve the display quality.

In one aspect, the present disclosure provides a display substrate, including a base substrate including a plurality of display units, wherein each of the plurality of display units is provided with an anode, an organic light-emitting layer and a cathode, wherein anodes of different display units are separated from each other. The display substrate further includes: a plurality of cathode lines arranged between cathodes and the base substrate, and configured to be connected to driving Integrated Circuits (ICs); and an insulating layer arranged between the cathode lines and the cathodes, wherein a plurality of cathode windows corresponding to the cathode lines are formed in the insulating layer, wherein at least part of the plurality of cathode windows respectively corresponds to at least two display regions, a cathode at each of the display regions is connected to the respective cathode line via the cathode window corresponding to the display region.

Furthermore, the plurality of display units is divided into a plurality of groups, each of the plurality of groups includes two display units adjacent to each other and arranged in a first direction, the first direction is an extending direction of the cathode, and the cathode window is arranged between adjacent two groups of display units in the first direction. Cathodes of two display units in different groups and adjacent to the cathode window in the first direction are connected to the cathode line via the cathode window.

Furthermore, each of the display units includes the display region and a non-display region, and the non-display region is not arranged between two display units in a same group.

Furthermore, each of the display units includes a pre-determined number of cathode patterns parallel to each other; and a pre-determined number of cathode windows are arranged between adjacent two groups of display units in the first direction, the pre-determined number of cathode windows correspond to the cathode patterns of the adjacent two groups of display units in the first direction respectively, and the cathode patterns are connected to the cathode lines via the corresponding cathode windows.

Furthermore, each of cathode patterns of each display region is of a strip shape and extends in the first direction, and the cathode patterns are arranged in a second direction. Among the display regions arranged in the first direction, the cathode patterns of each display unit correspond to the cathode patterns of any other display unit respectively, and the corresponding cathode patterns of the display regions are formed integrally to be of the strip shape.

Furthermore, the first direction is a row direction, and the second direction is a column direction; or the first direction is the column direction, and the second direction is the row direction.

Furthermore, each of the display units includes the display region and a non-display region, and the cathode lines extend through the display regions and are connected to the driving ICs.

Furthermore, the display substrate further includes: a plurality of anode lines, wherein the anode of each of the display units is connected to the driving IC via the respective anode line, each of the anode lines extends through the respective display region, and the anode lines and the cathode lines are arranged at different layers.

In another aspect, the present disclosure further provides a display panel including the above display substrate.

In addition, the present disclosure further provides a display device including the above display panel and at least one driving IC. Each of the driving ICs is connected to at least one cathode line in the display substrate.

Furthermore, the driving ICs correspond to the display units of the display substrate respectively. The cathode lines are connected to cathodes of each of the display units via the respective cathode window, and further connected to the driving IC corresponding to the display region.

Furthermore, cathode patterns in each of the display units are configured to be driven by a plurality of driving ICs at different locations.

BRIEF DESCRIPTION OF THE DRAWINGS

In order to make the technical solutions in embodiments of the present disclosure more apparent, drawings need to be used in the embodiments will be briefly described hereinafter. Obviously, drawings in the following descriptions are merely some of the embodiments of the present disclosure, and based on these drawings, a person skilled in the art may obtain other drawings without any creative labors.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Figure 1:
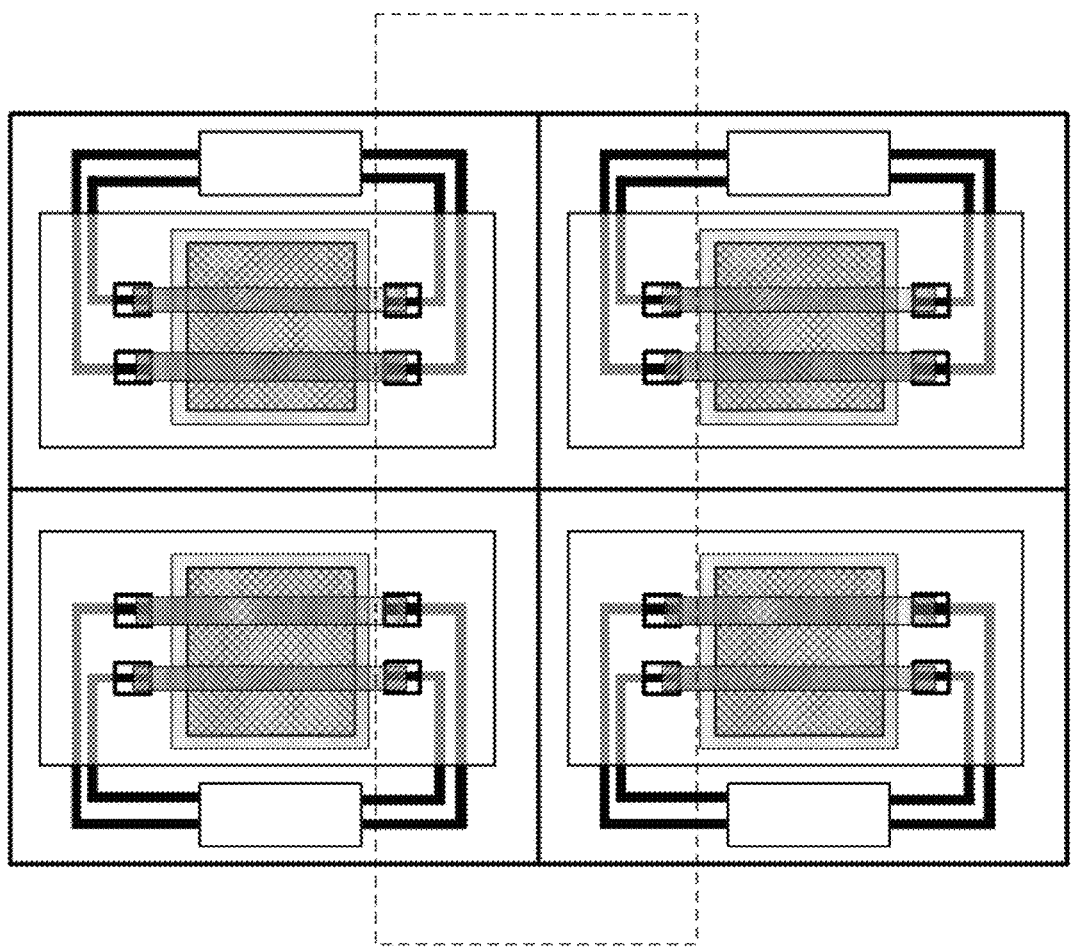
FIG. 1 is a schematic view showing a structure of a large-sized OLED display substrate in the related art.

As shown in FIG. 1, each of the individual OLED display substrates includes a display region and non-display region (i.e., the region indicated by the dotted lines) at the periphery of the display region. The non-display region needs to be provided with cathode windows (i.e., rectangles indicated by solid lines within the region indicated by the dotted lines) and cathode lines (i.e., black lines within the region indicated by the dotted lines). In addition, some areas are reserved for a subsequent cell alignment process, which includes areas for evaporation and packaging.

The present disclosure provides a solution, so as to overcome the defect of large non-display splicing region between every two individual small-sized display substrates of the large-sized OLED display device in the related art.

Figure 2:
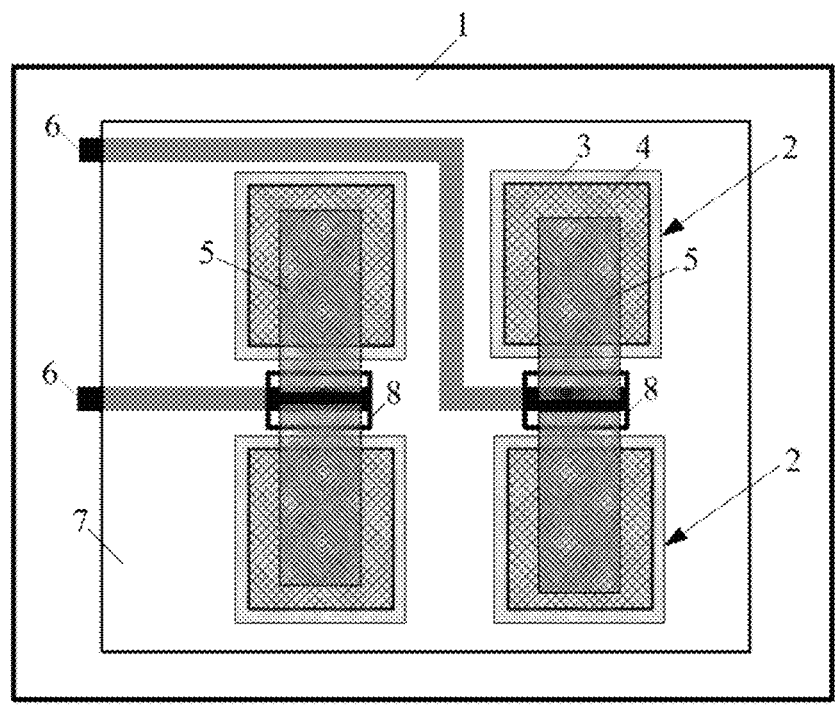
FIG. 2 is a schematic top view showing a display substrate according to an embodiment of the present disclosure.

In one aspect, as shown in FIG. 2, the present disclosure provides in at least one embodiment a display substrate including: a base substrate 1 including a plurality of display units 2, wherein each of the plurality of display units 2 is provided with an anode 3 (anodes 3 of different display units are separated from each other), an organic light-emitting layer 4 and a cathode 5, that is, each of the display units 2 corresponds to a basic structure of a OLED, and may display an image independently, which is similar to the small-sized OLED display substrate in the related art.

The display substrate further includes a plurality of cathode lines 6 arranged between the cathodes 5 and the base substrate 1, and configured to be connected to driving ICs; and an insulating layer 7 arranged between the cathode lines 6 and the cathodes 5, wherein a plurality of cathode windows 8 corresponding to the cathode lines 6 are formed in the insulating layer 7, wherein each or one or more of the cathode windows 8 corresponds to at least two display regions 2, a cathode 5 at each of the display regions is connected to the respective cathode line 6 via the cathode window 8 corresponding to the display region.

In the embodiment of the present disclosure, due to the fact an identical voltage may be applied to cathodes of different display units in the OLED display technology, cathodes of at least two display units may share a common cathode window, so as to be connected to a same cathode line. As a result, the number of the cathode windows may be effectively reduced, such that the display units may be arranged in a more compact manner, and thereby reducing the area of the non-display region of the base substrate and improving the display effect.

In the following, the display substrate will be further explained according to an embodiment of the present disclosure.

Figure 3:
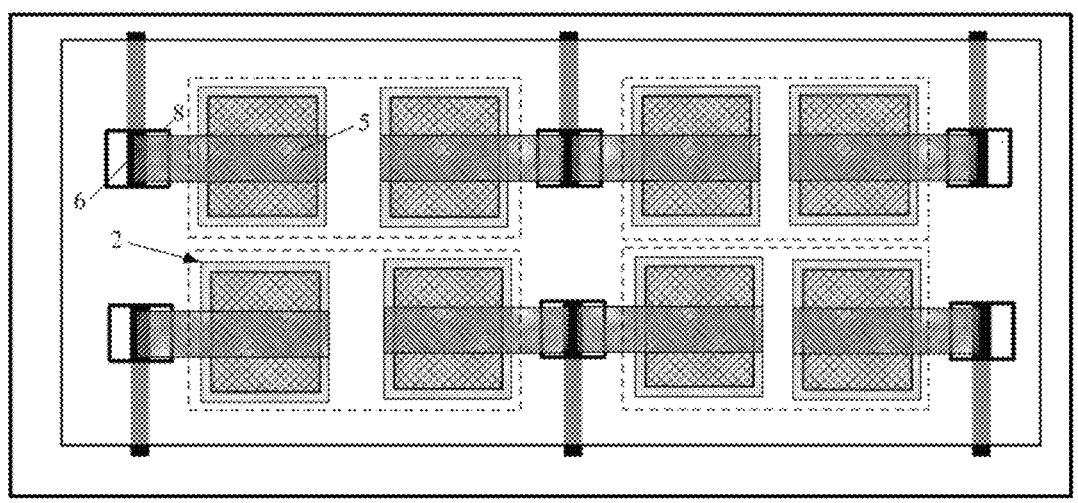
FIGS. 3-7 are schematic views showing a detail structure of the display substrate according to an embodiment of the present disclosure.

As shown in FIG. 3, according to the embodiment of the present disclosure, the display units are divided into a plurality of groups (i.e., the rectangles indicated by dotted lines in FIG. 3), each of the plurality of groups includes two display units 2 arranged in a first direction (e.g., a row direction). The first direction is an extending direction of the cathode 5 of each of the display units 2 (in this embodiment, the first direction is the row direction), and the cathode window 8 is arranged between the adjacent two groups of display units, wherein cathodes 5 of two display units 2 in different groups and adjacent to the cathode window 8 in the first direction are connected to the cathode line 6 via the cathode window.

On the basis of the structure shown in FIG. 3, adjacent two display units in a lateral direction may share a common cathode window.

Figure 4:
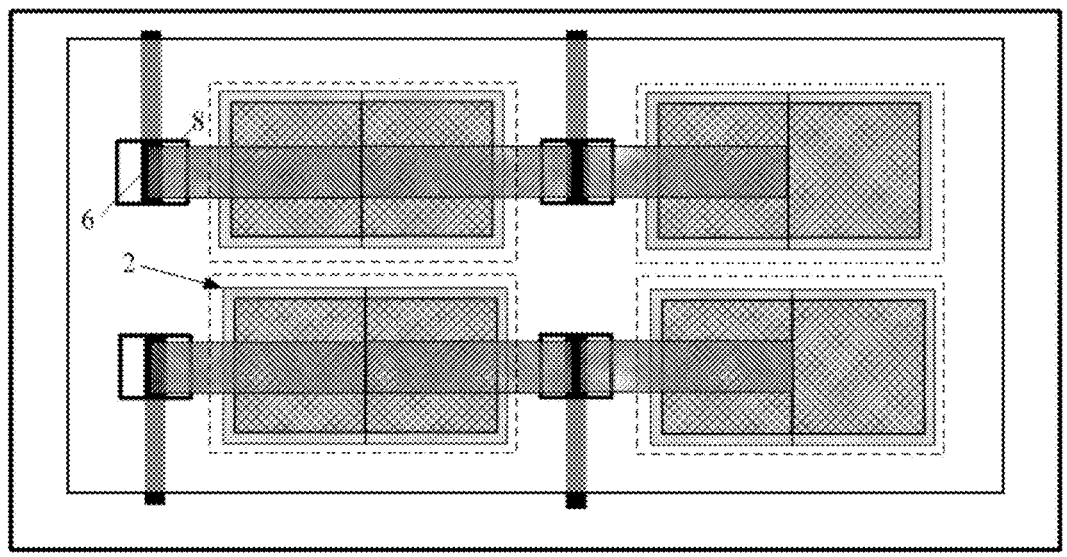

It should be noted that, in the embodiment of the present disclosure, the display unit may be regarded as a display substrate having a small size, and therefore the display unit includes the display region (i.e., the region of the organic light-emitting layer) and a non-display region. Optionally, as shown in FIG. 4, in order to further reduce an area of the non-display region relative to an area of the display region, two display units 2 in a same group are further connected to each other on the basis of the arrangement in FIG. 3, that is, the non-display region is not arranged between two display units 2 in a same group, and thus further reducing the area of the non-display region.

Figure 5:
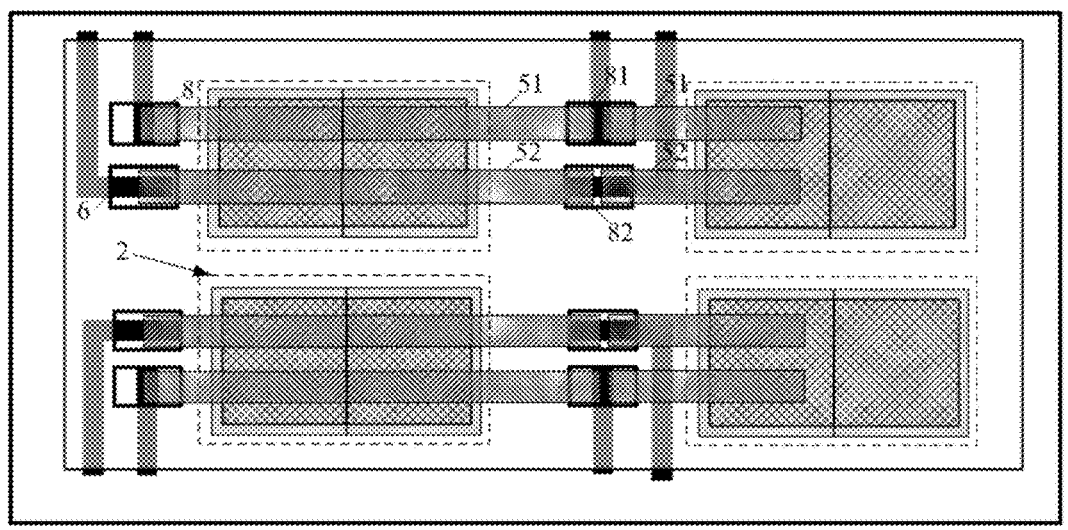

In practical implementation, as shown in FIG. 5, the cathode of each of the display units includes a pre-determined number of cathode patterns 51, 52 (two cathode patterns in this embodiment) parallel to each other. In addition, the number of the cathode windows arranged between adjacent two groups of display units in the row direction is identical to the number of the cathode patterns 51, 52 of the display unit, that is, a same pre-determined number of cathode windows 81, 82 are arranged between adjacent two groups of display units, and the pre-determined number of cathode windows 81, 82 correspond to the cathode patterns 51, 52 of the adjacent two groups of display units in the first direction respectively, and the cathode patterns are connected to the cathode lines via merely the corresponding cathode windows.

Furthermore, as shown in 6, each of cathode patterns 51, 52 of each display region is of a strip shape and extends in the first direction, and the cathode patterns 51, 52 are arranged in a second direction, and among the display regions arranged in the first direction, cathode patterns of each display unit correspond to the cathode patterns of any other display unit respectively, and the corresponding cathode patterns of the display regions are formed integrally to be of the strip shape.

Figure 6:
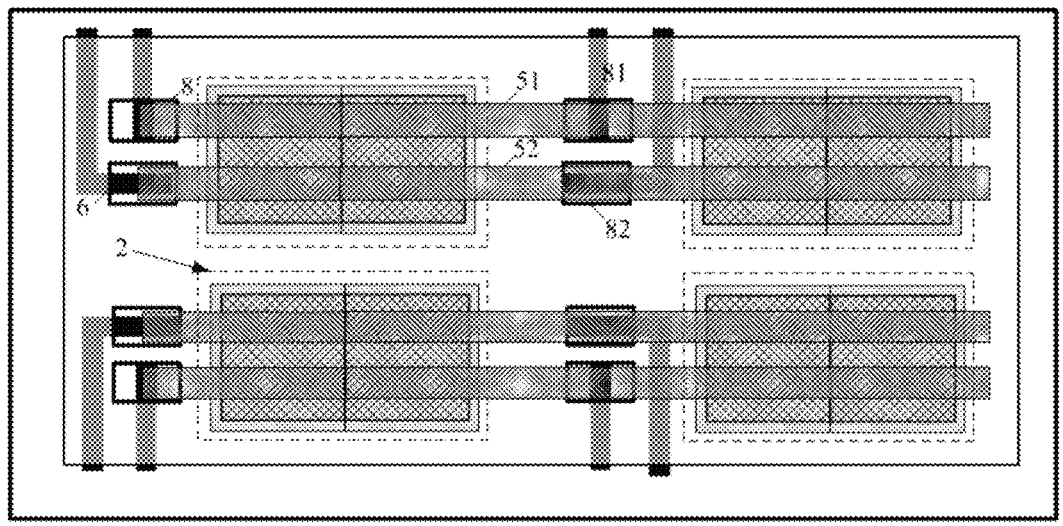

On the basis of the structure shown in FIG. 6, during the manufacturing process of the display substrate, the cathode patterns of all of the display units may be implemented in single patterning process.

In addition, it can be seen from the structure shown in FIG. 6 that, a cathode pattern may be formed by connecting a plurality of cathode lines via a plurality of cathode windows at different locations, and thereby may be driven by a plurality of driving ICs, which may prevent the cathode pattern from being too large to be driven.

In the related art, the OLED display substrate further includes an anode line configured to connect the anode and the driving IC. The anode line is arranged below an anode layer, the anode line and the anode layer are further separated by another layer, and the anode line and the anode layer are connected through a via hole arranged in the other layer. It should be noted that, a size of the cathode window needs to be much larger than a size of the via hole. In the related art, the via hole may be arranged within the display region, and therefore the anode line may be arranged within the display region. However, the cathode window has to be arranged within the non-display region due to its large size. Since at least a part of the cathode line needs to be exposed by the cathode window to be connected to the cathode, as shown in FIG. 1, the cathode line is arranged in the non-display region and connected to the driving IC.

Figure 7:
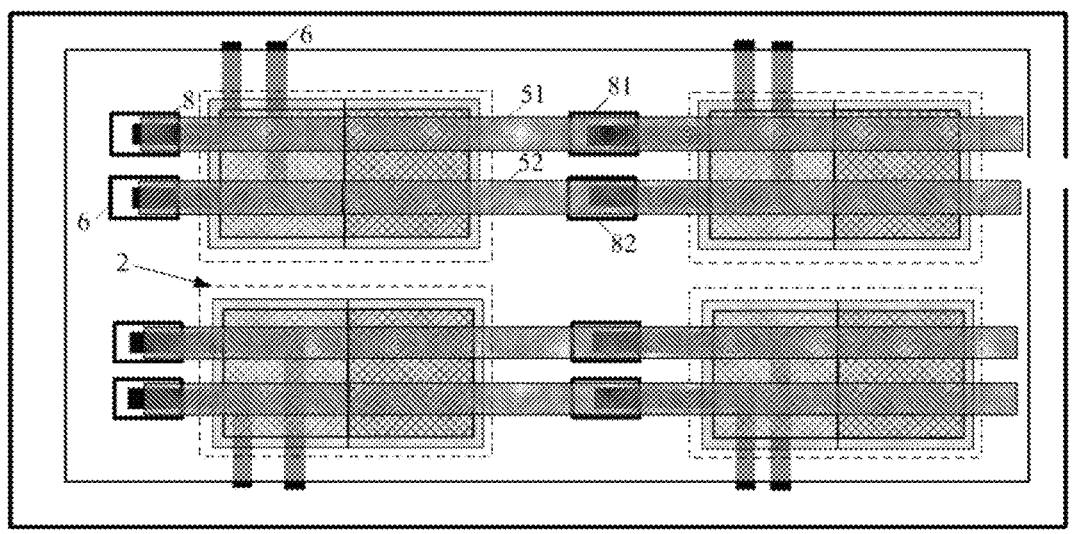

In the embodiment of the present disclosure, as shown in FIG. 7, in order to arrange the display regions in a more compact manner, the cathode line 6 is further configured to extend through the display regions and be connected to the driving IC via the display region, thus reducing the non-display region between the display regions in each group. In a practical implementation, the cathode line 6 and the anode line may be arranged at different layers, and thus preventing the cathode line 6 in the display region from occupying a location for the anode line.

On the basis of the above structure according to the embodiment of the present disclosure, a large-sized display substrate may be formed directly on the base substrate; in contrast, in the related art, firstly a plurality of display units has to be manufactured separately, and then these display units are spliced into a large-sized display substrate. It can be seen from above that, the structure of the display substrate according to the present disclosure may simplify the manufacturing process, which significantly reduces the production cost and improves the production efficiency.

The above explanations are for illustration purpose only, and shall not be used to limit the scope of the present disclosure. For example, the first direction may be the column direction, and in that case, correspondingly, the second direction is the row direction. In addition, more than two display units may share a common cathode window, which may be implemented in a similar manner, and thus will not be further explained herein.

In another aspect, the present disclosure further provides a display panel including the above display substrate. In the display substrate according to the present disclosure, the non-display region of the display panel is effectively reduced, and therefore the display quality is improved.

Figure 8:
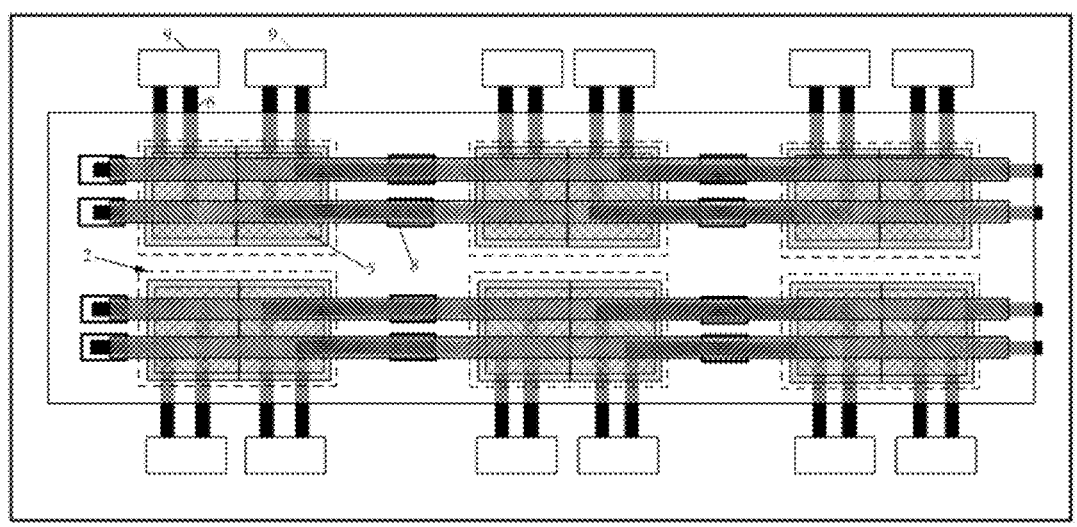
FIG. 8 is a schematic view showing a structure of a display device according to an embodiment of the present disclosure.

In addition, the present disclosure further provides a display device including the above display panel. As shown in FIG. 8, the display device is further provided with at least one driving IC 9, and each of the at least one driving IC 9 is connected to at least one cathode line 6 in the display substrate.

According to the embodiment of the present disclosure, the driving ICs 9 may correspond to the display units 2 of the display substrate respectively. The cathode lines 6 connected to the cathodes of each of the display units 2 via the respective cathode window 8 are further connected to the driving IC corresponding to the display region.

According to the structure shown in FIG. 8, cathode patterns 5 in each of the display units 2 are configured to be driven by a plurality of driving ICs 9 at different locations, and thus preventing a voltage of the driving signal from being attenuate due to the large size of the cathode pattern, which makes a luminance of the display screen more uniform, and improves the user experience.

The above are preferred embodiments of the present disclosure, and it should be note that, a person skilled in the art may make improvements and modifications without departing from the principle of the present disclosure, and these improvements and modifications shall also fall within the scope of the present disclosure.

What is claimed is:

1. A display substrate, comprising a base substrate comprising a plurality of display units, wherein each of the plurality of display units is provided with an anode, an organic light-emitting layer and a cathode, wherein anodes of different display units are separated from each other, and the display substrate further comprises:
    a plurality of cathode lines arranged between cathodes and the base substrate, and configured to be connected to driving Integrated Circuits (ICs); and
    an insulating layer arranged between the cathode lines and the cathodes, wherein a plurality of cathode windows corresponding to the cathode lines are formed in the insulating layer,
    wherein at least part of the plurality of cathode windows respectively corresponds to at least two display regions, a cathode at each of the display regions is connected to the respective cathode line via the cathode window corresponding to the display region.

2. The display substrate according to claim 1, wherein
    the plurality of display units is divided into a plurality of groups, each of the plurality of groups comprises two display units adjacent to each other and arranged in a first direction, the first direction is an extending direction of the cathode, and the cathode window is arranged between the adjacent two groups of display units in the first direction; and cathodes of two display units in different groups and adjacent to the cathode window in the first direction are connected to the cathode line via the cathode window.

3. The display substrate according to claim 2, wherein each of the display units comprises the display region and a non-display region, and the non-display region is not arranged between two display units in a same group.

4. The display substrate according to claim 2, wherein
each of the display units comprises a pre-determined number of cathode patterns parallel to each other; and
a pre-determined number of cathode windows are arranged between adjacent two groups of display units in the first direction, the pre-determined number of cathode windows correspond to the cathode patterns of the adjacent two groups of display units in the first direction respectively, and the cathode patterns are connected to the cathode lines via the corresponding cathode windows.

5. The display substrate according to claim 4, wherein
each of cathode patterns of each display region is of a strip shape and extends in the first direction, and the cathode patterns are arranged in a second direction; and
among the display regions arranged in the first direction, the cathode patterns of each display unit correspond to the cathode patterns of any other display unit respectively, and the corresponding cathode patterns of the display regions are formed integrally to be of the strip shape.

6. The display substrate according to claim 5, wherein
the first direction is a row direction, and the second direction is a column direction; or
the first direction is the column direction, and the second direction is the row direction.

7. The display substrate according to claim 1, wherein each of the display units comprises the display region and a non-display region, and the cathode lines extend through the display regions and are connected to the driving ICs.

8. The display substrate according to claim 7, further comprising:
a plurality of anode lines,
wherein the anode of each of the display units is connected to the driving IC via the respective anode line, each of the anode lines extends through the respective display region, and the anode lines and the cathode lines are arranged at different layers.

9. The display substrate according to claim 2, wherein each of the display units comprises the display region and a non-display region, and the cathode lines extend through the display regions and are connected to the driving ICs.

10. The display substrate according to claim 9, further comprising:
a plurality of anode lines,
wherein the anode of each of the display units is connected to the driving IC via the respective anode line, each of the anode lines extends through the respective display region, and the anode lines and the cathode lines are arranged at different layers.

11. A display panel, comprising the display substrate according to claim 1.

12. The display panel according to claim 11, wherein
the plurality of display units is divided into a plurality of groups, each of the plurality of groups comprises two display units adjacent to each other and arranged in a first direction, the first direction is an extending direction of the cathode, and the cathode window is arranged between the adjacent two groups of display units in the first direction; and
cathodes of two display units in different groups and adjacent to the cathode window in the first direction are connected to the cathode line via the cathode window.

13. The display panel according to claim 12, wherein each of the display units comprises the display region and a non-display region, and the non-display region is not arranged between two display units in a same group.

14. The display panel according to claim 12, wherein
each of the display units comprises a pre-determined number of cathode patterns parallel to each other; and
a pre-determined number of cathode windows are arranged between adjacent two groups of display units in the first direction, the pre-determined number of cathode windows correspond to the cathode patterns of the adjacent two groups of display units in the first direction respectively, the cathode patterns are connected to the cathode lines via the corresponding cathode windows.

15. The display panel according to claim 14, wherein
each of cathode patterns of each display region is of a strip shape and extends in the first direction, and the cathode patterns are arranged in a second direction; and
among the display regions arranged in the first direction, the cathode patterns of each display unit correspond to the cathode patterns of any other display unit respectively, and the corresponding cathode patterns of the display regions are formed integrally to be of the strip shape.

16. The display panel according to claim 15, wherein
the first direction is a row direction, and the second direction is a column direction; or
the first direction is the column direction, and the second direction is the row direction.

17. A display device, comprising the display panel according to claim 11 and at least one driving IC;
wherein each of the driving ICs is connected to at least one cathode line in the display substrate.

18. The display device according to claim 17, wherein
the driving ICs correspond to the display units of the display substrate respectively;
the cathode lines are connected to the cathodes of each of the display units via the respective cathode window, and further connected to the driving IC corresponding to the display region.

19. The display device according to claim 18, wherein cathode patterns in each of the display units are configured to be driven by a plurality of driving ICs at different locations.

* * * * *